(12) United States Patent
Hsieh et al.

(10) Patent No.: US 7,154,121 B2
(45) Date of Patent: Dec. 26, 2006

(54) LIGHT EMITTING DEVICE WITH A MICRO-REFLECTION STRUCTURE CARRIER

(75) Inventors: Min-Hsun Hsieh, Hsin-Chu (TW); Wen-Huang Liu, Hsin-Chu (TW)

(73) Assignee: Epistar Corporation, Hsinchu (TW)

(*) Notice: Subject to any disclaimer, the term of this patent is extended or adjusted under 35 U.S.C. 154(b) by 102 days.

(21) Appl. No.: 10/605,808

(22) Filed: Oct. 29, 2003

(65) Prior Publication Data

US 2004/0119084 A1    Jun. 24, 2004

(30) Foreign Application Priority Data

Dec. 23, 2002    (TW)    .................. 91137557 A

(51) Int. Cl.
| | |
|---|---|
| H01L 29/06 | (2006.01) |
| H01L 29/09 | (2006.01) |
| H01L 27/15 | (2006.01) |
| H01L 33/00 | (2006.01) |
| H01L 31/00 | (2006.01) |

(52) U.S. Cl. .................. 257/79; 257/11; 257/12; 257/13; 257/14; 257/51; 257/82; 257/85; 257/90; 257/94; 257/95; 257/98; 257/102; 257/183; 257/200

(58) Field of Classification Search ............. None
See application file for complete search history.

(56) References Cited

U.S. PATENT DOCUMENTS

| | | | | |
|---|---|---|---|---|
| 3,954,534 A | * | 5/1976 | Scifres et al. ............ | 438/29 |
| 4,935,665 A | * | 6/1990 | Murata .................... | 313/500 |
| 5,633,527 A | * | 5/1997 | Lear ....................... | 257/432 |
| 6,015,719 A | * | 1/2000 | Kish et al. ................ | 438/29 |
| 6,091,083 A | * | 7/2000 | Hata et al. ............... | 257/79 |
| 6,320,206 B1 | * | 11/2001 | Coman et al. ............ | 257/94 |
| 6,369,506 B1 | * | 4/2002 | Hata ........................ | 313/499 |
| 6,433,487 B1 | * | 8/2002 | Yamazaki ................ | 315/169.3 |
| 6,504,180 B1 | * | 1/2003 | Heremans et al. ........ | 257/98 |
| 6,577,006 B1 | * | 6/2003 | Oota et al. ................ | 257/745 |
| 6,623,998 B1 | * | 9/2003 | Shibata et al. ............ | 438/22 |
| 6,720,586 B1 | * | 4/2004 | Kidoguchi et al. ....... | 257/103 |
| 6,794,690 B1 | * | 9/2004 | Uemura .................... | 257/183 |
| 6,841,808 B1 | * | 1/2005 | Shibata et al. ............ | 257/190 |
| 7,053,420 B1 | * | 5/2006 | Tadatomo et al. ........ | 257/98 |
| 2001/0014629 A1 | * | 8/2001 | Anderson ................. | 473/345 |
| 2001/0050376 A1 | * | 12/2001 | Shibata et al. ............ | 257/190 |
| 2002/0048956 A1 | * | 4/2002 | Wipiejewski ............ | 438/691 |
| 2002/0057567 A1 | * | 5/2002 | Chen ........................ | 362/245 |
| 2002/0084462 A1 | * | 7/2002 | Tamai et al. .............. | 257/79 |
| 2002/0175352 A1 | * | 11/2002 | Cao .......................... | 257/258 |
| 2003/0026532 A1 | * | 2/2003 | Murry et al. ............. | 385/27 |
| 2003/0075723 A1 | * | 4/2003 | Heremans et al. ........ | 257/98 |
| 2004/0119093 A1 | * | 6/2004 | Cohen et al. ............. | 257/200 |

FOREIGN PATENT DOCUMENTS

| | | |
|---|---|---|
| JP | 52-023986 | 2/1977 |
| JP | 57-091575 | * 6/1982 |

(Continued)

Primary Examiner—Carl Whitehead, Jr.
Assistant Examiner—James Mitchell
(74) Attorney, Agent, or Firm—Winston Hsu

(57) ABSTRACT

A light emitting device includes a micro-reflection structure carrier, which is formed by performing etching process on a carrier, a reflection layer, a light emitting layer, and a transparent adhesive layer, wherein the reflection layer is formed over the micro-reflection structure carrier and adheres to the light emitting layer through the transparent adhesive layer.

21 Claims, 4 Drawing Sheets

FOREIGN PATENT DOCUMENTS

| | | | |
|---|---|---|---|
| JP | 60-119760 | | 6/1985 |
| JP | WO 90/05524 | * | 6/1989 |
| JP | 401297869 | * | 11/1989 |
| JP | 11266035 | * | 9/1999 |
| JP | 2004-95941 | | 3/2004 |

* cited by examiner

LIGHT EMITTING DEVICE WITH A MICRO-REFLECTION STRUCTURE CARRIER

BACKGROUND OF INVENTION

1. Field of the Invention

The present invention relates to a light emitting device, and more particularly, to a light emitting device with a micro-reflection structure carrier.

2. Description of the Prior Art

Light emitting devices are extensively applied to many fields. For instance, light emitting devices are utilized in optical displays, laser diodes, traffic lights, data storages, communication devices, illumination devices, and medical instruments. For developing light emitting devices, one of the most important issues is to raise light emitting efficiency of light emitting devices.

In US publication No. US 2002/0017652 A1, an AlGaInP light emitting device of an embedded micro-reflection structure is disclosed. Please refer to FIG. 1. FIG. 1 is a prior art AlGaInP light emitting device of an embedded micro-reflection structure. LM is a metallic layer, CS is a conductive substrate, LE is an epitaxial layer with a micro-reflection structure, and E1 is an electrode. An etching process is performed on the epitaxial layer to form the micro-reflection structure LE, wherein the shape of LE includes hemispheres or pyramids. The metallic reflection layer LM is deposited on the epitaxial layer LE. The top of LE is bonded with a conductive carrier, for instance, a silicon chip. An opaque substrate of the original LE is removed so that the light emitted to the opaque substrate can be emitted out. The micro-reflection structure can reflect the light emitted to the micro-reflection structure, hence increases the brightness of the light emitting device. Since the light emitting device is connected to a small part of the carrier at the top of the micro-reflector and the connecting area is small, the mechanical strength is not good enough which may cause the junction surface to be easily stripped off.

Furthermore, the micro-reflection structure is formed by performing etching process on the epitaxial layer, therefore the epitaxial layer has to grow to a predetermined thickness. If the epitaxial is not thick enough, it will have a detrimental effect on the reflection function of the micro-reflection structure. However, it takes a long time for the epitaxial layer to grow, hence the cost increases.

SUMMARY OF INVENTION

It is therefore a primary objective of the claimed invention to provide a light emitting device with a micro-reflection structural carrier.

Briefly described, the claimed invention discloses a light emitting device with a micro-reflection structure carrier. The light emitting device comprises a micro-reflection structure carrier, which is formed by etching process. The micro-reflection structure comprises hemispheres or pyramids. A reflection layer is then formed over the carrier and adheres to a light emitting layer through a transparent adhesive layer.

It is an advantage of the present invention that the time for the growth of the epitaxial layer is reduced and carrier is thick enough to form the specific geometric figures. Therefore the cost is lowered, and the light emitting efficiency is increased. Furthermore, since the light emitting device with the micro-reflection structure carrier disclosed in the claimed invention utilizes the transparent adhesive layer to adhere to the surface of the light emitting layer intensely, the mechanical strength of the structure is enhanced, the stripping of the junction surface is avoided, the process is simplified, and the reliability is increased.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
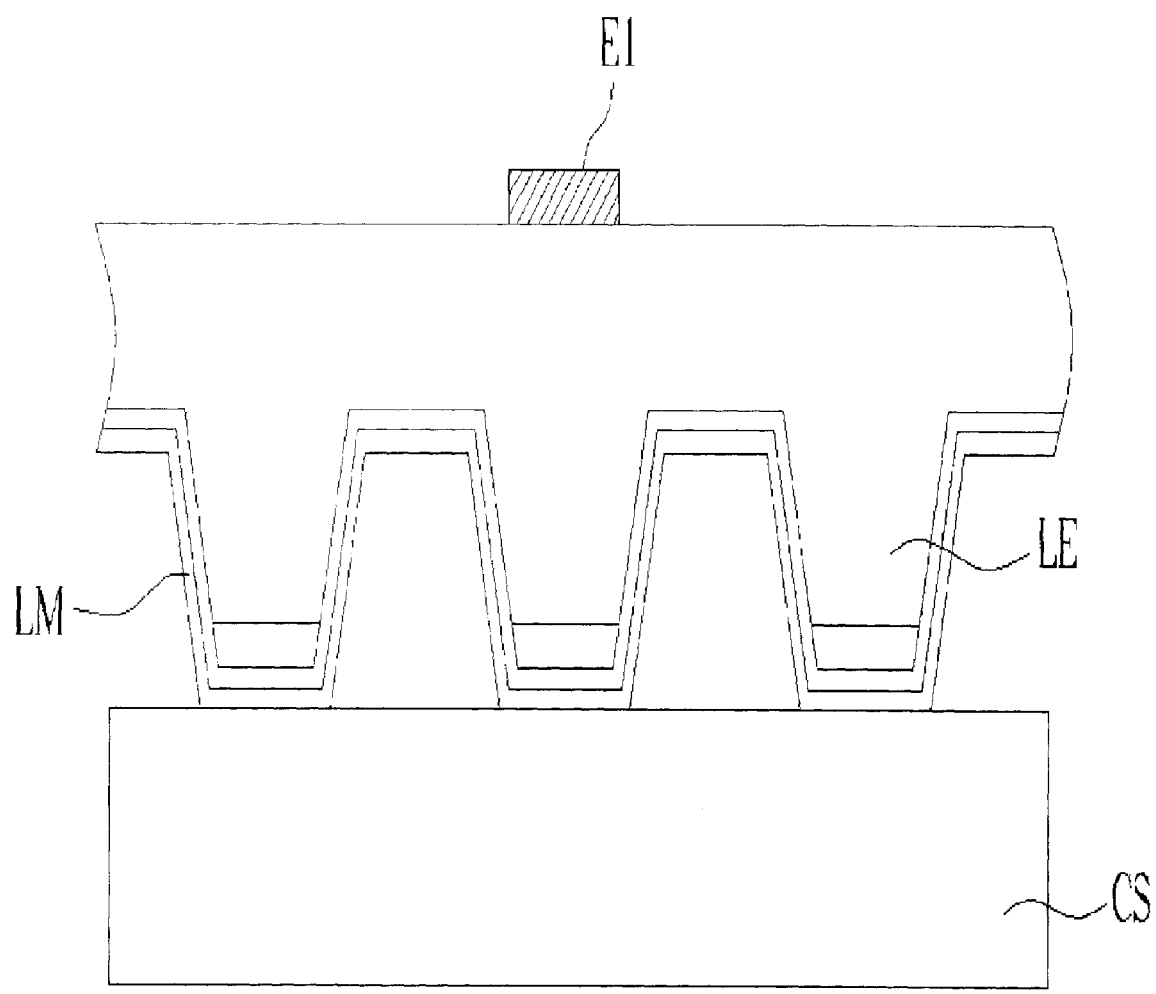
FIG. 1 is a prior art AlGaInP light emitting device having an embedded micro-reflection structure.
Figure 2:
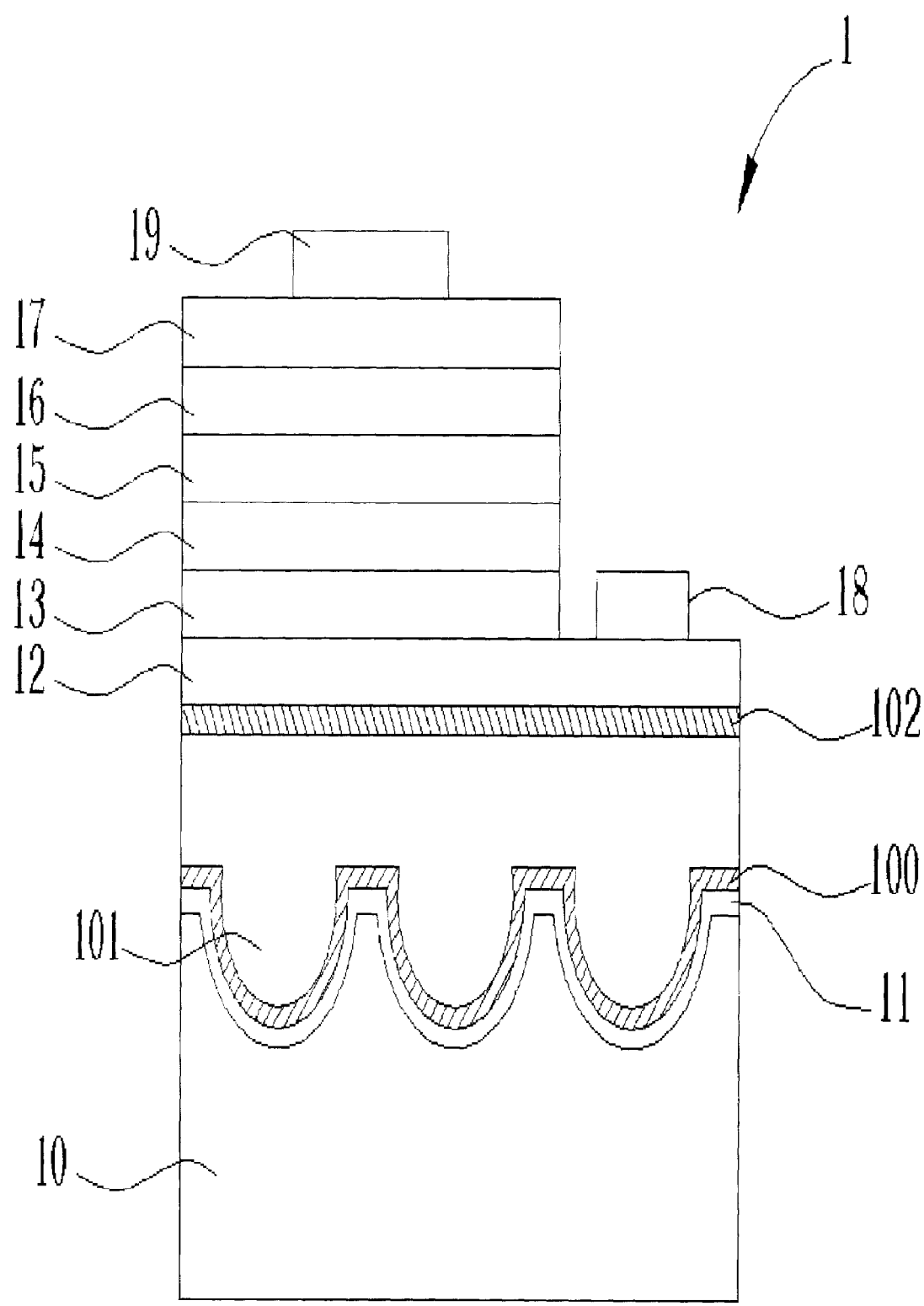
FIG. 2 is a first embodiment of the present invention light emitting device with a micro-reflection structure carrier.

Please refer to FIG. 2: FIG. 2 is a first embodiment of the present invention light emitting device with a micro-reflection structure carrier. 1 is a light emitting device with a micro-reflection structure carrier according to the present invention. 1 comprises a micro-reflection structure carrier 10, a reflection layer 11 formed over the micro-reflection structure carrier 10, a first reaction layer 100 formed over the reflection layer 11, a transparent adhesive layer 101 formed over the first reaction layer 100, a second reaction layer 102 formed over the transparent adhesive layer 101, a transparent conductive layer 12 formed over the second reaction layer 102, wherein a first surface area and a second surface are comprised on an upper surface of the transparent conductive layer 12, a first contact layer 13 formed over the first surface area, a first cladding layer 14 formed over the first contact layer 13, a light emitting layer 15 formed over the first cladding layer 14, a second cladding layer 16 formed over the light emitting layer 15, a second contact layer 17 formed over the second cladding layer 16, a first wiring electrode 18 formed over the second surface area, and a second wiring electrode 19 formed over the second contact layer 17. The purpose of locating the first reaction layer and the second reaction layer is to assist the adhesion between the transparent adhesive layer 101 and the reflection layer 11 or and the transparent conductive layer 12.

Figure 3:
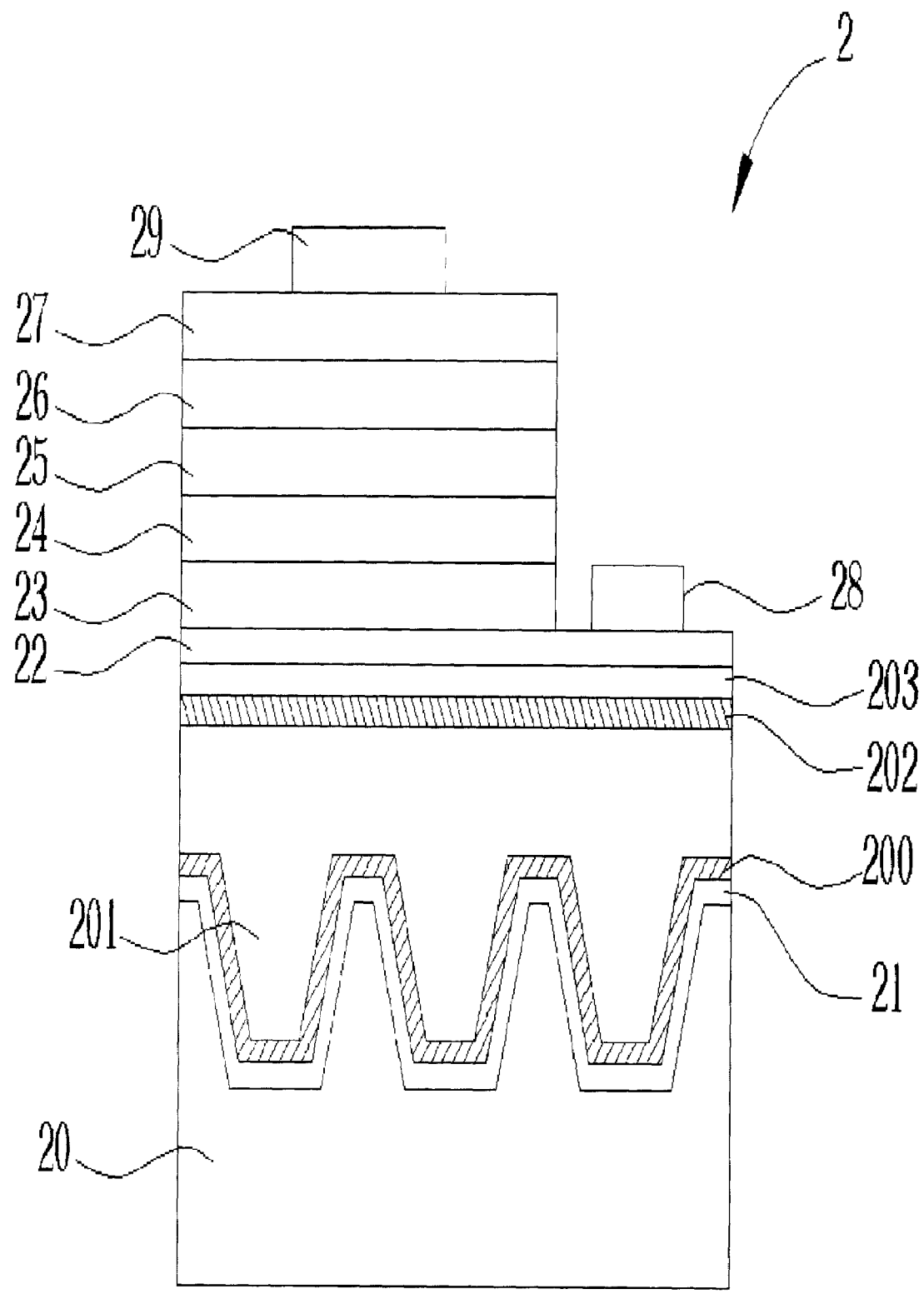
FIG. 3 is a second embodiment of the present invention light emitting device with a micro-reflection structure carrier.

Please refer to FIG. 3: FIG. 3 is a second embodiment of the present invention light emitting device with a micro-reflection structure carrier. 2 is a light emitting device with a micro-reflection structure carrier according to the second embodiment of the present invention. 2 comprises a micro-reflection structure carrier 20, a reflection layer 21 formed over the micro-reflection structure carrier 20, a first reaction layer 200 formed over the reflection layer 21, a transparent adhesive layer 201 formed over the first reaction layer 200, a second reaction layer 202 formed over the transparent adhesive layer 201, a transparent carrier 203 formed over the second reaction layer 202, a transparent conductive layer 22 formed over the transparent carrier 203, wherein a first surface area and a second surface are comprised on an upper surface of the transparent conductive layer 22, a first contact layer 23 formed over the first surface area, a first cladding layer 24 formed over the first contact layer 23, a light emitting layer 25 formed over the first cladding layer 24, a second cladding layer 26 formed over the light emitting layer 25, a second contact layer 27 formed over the second cladding layer 26, a first wiring electrode 28 formed over the second surface area, and a second wiring electrode 29 formed over the second contact layer 27. The purpose of the aforementioned first reaction layer and the second reaction layer is to assist the adhesion between the transparent adhesive layer 201 and the reflection layer 21 or/and the transparent carrier 203.

Figure 4:
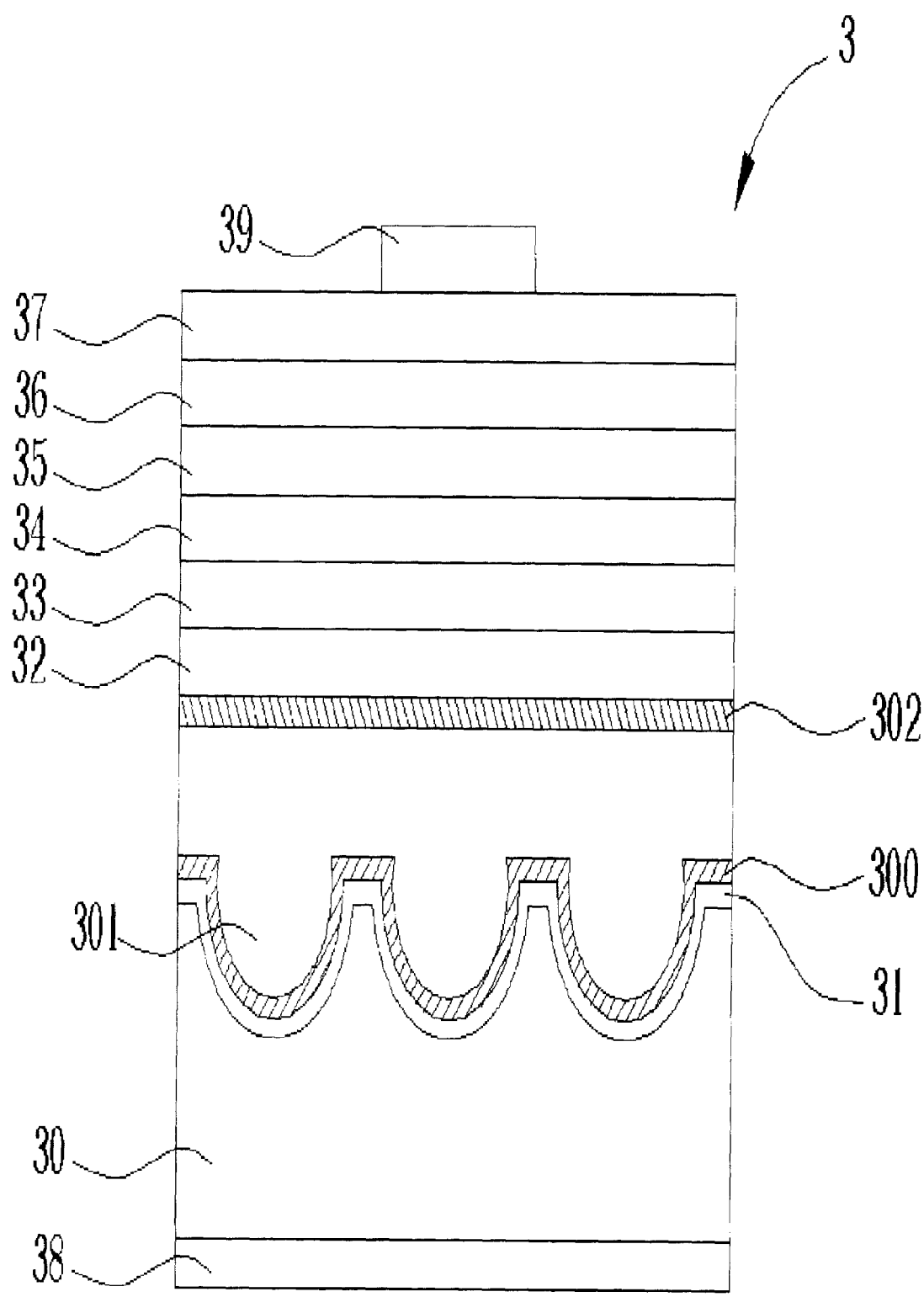
FIG. 4 is a third embodiment of the present invention light emitting device with a micro-reflection structure carrier.

Please refer to FIG. 4: FIG. 4 is a third embodiment of the present invention light emitting device with a micro-reflection structure carrier. 3 is a light emitting device with a micro-reflection structure carrier according to the third embodiment of the present invention. 3 comprises a micro-reflection structure conductive carrier 30, a reflection layer 31 formed over the micro-reflection structure conductive carrier 30, a first reaction layer 300 formed over the reflection layer 31, a transparent conductive adhesive layer 301 formed over the first reaction layer 300, a second reaction layer 302 formed over the transparent conductive adhesive layer 301, a transparent conductive layer 32 formed over the second reaction layer 302, a first contact layer 33 formed over the transparent conductive layer 32, a first cladding layer 34 formed over the first contact layer 33, a light emitting layer 35 formed over the first cladding layer 34, a second cladding layer 36 formed over the light emitting layer 35, a second contact layer 37 formed over the second cladding layer 36, a first electrode 38 formed over a lower surface of the micro-reflection structure carrier 30, and a second electrode 39 formed over the second contact layer 37. The purpose of the aforementioned first reaction layer and the second reaction layer is to assist the adhesion between the transparent conductive adhesive layer 301 and the reflection layer 31 or and the transparent conductive layer 32, and it also helps to form ohmic contact on the junction surface.

In the three aforementioned embodiments, another transparent conductive layer may be formed between the second wiring electrode and the second contact layer. The shape of the aforementioned micro-reflection structure comprises at least one shape of the following: a hemisphere or a pyramid. The aforementioned micro-reflection structure carrier comprises at least one material selected from the group consisting of GaP, GaAs, GaAsP, InGaP, AlGaInP, AlGaAs, Si, SiC, glass, BN, AlN, and Ge. The aforementioned micro-reflection structure conductive carrier comprises at least one material selected from the group consisting of Si, GaAs, SIC, GaP, GaAsP, InGaP, AlGaInP, AlGaAs, BN, and AlN. The aforementioned transparent carrier comprises at least one material selected from the group consisting of GaP, SiC, $Al_2O_3$, and glass. The aforementioned reflection layer comprises at least one material selected from the group consisting of Sn, Al, Au, Pt, Zn, Ag, Ti, Pb, Pd, Ge, Cu, AuBe, AuGe, Ni, PbSn, arid AuZn. The aforementioned transparent conductive layer comprises at least one material selected from the group consisting of indium tin oxide, cadmium tin oxide, antimony tin oxide, zinc oxide, and zinc tin oxide. The aforementioned first and second cladding, layer comprise at least one material selected from the group consisting of AlGaInP, AlN, GaN, AlGaN, InGaN, and AlInGaN. The aforementioned light emitting layer comprises at least one material selected from the group consisting of AlGaInP, GaN, InGaN, and AlInGaN. The aforementioned first and second contact layer comprise at least one material selected from the group consisting of GaP, GaAs, GaAsP, InGaP, AlGaInP, AlGaAs, GaN, InGaN, and AlGaN. The aforementioned transparent adhesive layer comprises at least one material selected from the group consisting of polyimide (PI), benzocyclobutene (BCB), and perfluorocyclobutane (PFCB). The aforementioned first and second reaction layer comprise at least one material selected from the group consisting of SiNx, Ti, and Cr.

The present invention discloses a light emitting device with a micro-reflection structure carrier. The light emitting device comprises a micro-reflection structure carrier, which is formed by performing etching process. The micro-reflection structure comprises hemispheres or pyramids. A reflection layer is formed over the carrier and adheres to a light emitting layer through a transparent adhesive layer. In the present invention, the time for the growth of the epitaxial layer is reduced and only one carrier is enough to reach enough thickness to form the specific geometric figures. Therefore the cost is lowered, and the light emitting efficiency is increased. Furthermore, the mechanical strength of the structure is enhanced, the stripping of the junction surface is avoided, the process is simplified, and the reliability is increased.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A light emitting device comprising:
   a micro-reflection structure carrier having a plurality of concave surfaces;
   a reflection layer formed conformably to said plurality of concave surfaces;
   a first reaction layer formed over the reflection layer;
   a transparent adhesive layer formed over the first reaction layer; and
   a light emitting stack layer formed over the transparent adhesive layer, the light emitting stack layer comprising:
      a second reaction layer formed over the transparent adhesive layer;
      a first transparent conductive layer formed over the second reaction layer;
      a first contact layer formed over the transparent conductive layer;
      a first cladding layer formed between the first contact layer and the light emitting layer;
      a second cladding layer formed over the light emitting layer;
      a second contact layer formed over the second cladding layer;
      a first electrode; and
      a second electrode formed over the second contact layer.

2. The light emitting device of claim 1 further comprising a reaction layer between the transparent adhesive layer and the light emitting stack layer.

3. The light emitting device of claim 2, wherein the reaction layer comprises at least one material selected from a group consisting of SiNx, Ti, and Cr.

4. The light emitting device of claim 1 further comprising a first electrode and a second electrode formed on the same upper surface of the light emitting stack layer.

5. The light emitting device of claim 1, wherein the transparent conductive layer has a first surface area and a second surface area, the first contact layer is formed over the first surface area, and the first electrode is formed over the second surface area.

6. The light emitting device of claim 5 further comprising a transparent carrier between the second reaction layer and the transparent conductive layer.

7. The light emitting device of claim 6, wherein the transparent carrier comprises at least one material selected from a group consisting of GaP, SiC, Al$_2$O$_3$, and glass.

8. The light emitting device of claim 1, wherein the shape of the micro-reflection structure carrier comprises a hemisphere.

9. The light emitting device of claim 1, wherein the micro-reflection structure carrier comprises at least one material selected from a group consisting of GaP, GaAs, GaAsP, InGaP, AlGaInP, AlGaAs, Si, SiC, glass, BN, AlN, and Ge.

10. The light emitting device of claim 1, wherein the reflection layer comprises at least one material selected from a group consisting of Sn, Al, Au, Pt, Zn, Ag, Ti, Pb, Pd, Ge, Cu, AuBe, AuGe, Ni, PbSn, and AuZn.

11. The light emitting device of claim 1, wherein the second reaction layer comprises at least one material selected from a group consisting of SiNx, Ti, and Cr.

12. The light emitting device of claim 1, wherein the first cladding layer comprises at least one material selected from a group consisting of AlGaInP, AlN, GaN, AlGaN, InGaN, and AlInGaN.

13. The light emitting device of claim 1, wherein the light emitting layer comprises at least one material selected from a group consisting of AlGaInP, GaN, InGaN, and AlInGaN.

14. The light emitting device of claim 1, wherein the second cladding layer comprises at least one material selected from a group consisting of AlGaInP, AlN, GaN, AlGaN, InGaN, and AlInGaN.

15. The light emitting device of claim 1, wherein the first contact layer comprises at least one material selected from a group consisting of GaP, GaAs, GaAsP, InGaP, AlGaInP, AlGaAs, GaN, InGaN, and AlGaN.

16. The light emitting device of claim 1, wherein the second contact layer comprises at least one material selected from a group consisting of GaP, GaAs, GaAsP, InGaP, AlGaInP, AlGaAs, GaN, InGaN, and AlGaN.

17. The light emitting device of claim 1, wherein a second transparent conductive layer is formed between the second electrode and the second contact layer.

18. The light emitting device of claim 17, wherein the second transparent conductive layer comprises at least one material selected from a group consisting of indium tin oxide, cadmium tin oxide, antimony tin oxide, zinc oxide, and zinc tin oxide.

19. The light emitting device of claim 1, wherein the first transparent conductive layer comprises at least one material selected from a group consisting of indium tin oxide, cadmium tin oxide, antimony tin oxide, zinc oxide, and zinc tin oxide.

20. A light emitting device comprising:
a micro-reflection structure carrier having a plurality of concave surfaces;
a reflection layer formed conformably to said plurality of concave surfaces;
a transparent adhesive layer formed over the reflection layer, wherein the transparent adhesive layer comprises at least one material selected from a group consisting of polyimide (PI), benzocyclobutene (BCB), and perfluorocyclobutane (PFCB); and
a light emitting stack layer formed over the transparent adhesive layer.

21. A light emitting device comprising:
a micro-reflection structure carrier having a plurality of concave surfaces;
a reflection layer formed conformably to said plurality of concave surfaces;
a first reaction layer formed over the reflection layer, wherein the first reaction layer comprises at least one material selected from a group consisting of SiNx, Ti, and Cr;
a transparent adhesive layer formed over the first reaction layer; and a light emitting stack layer formed over the transparent adhesive layer.

\* \* \* \* \*